United States Patent
Yoon et al.

(10) Patent No.: US 12,526,939 B2
(45) Date of Patent: Jan. 13, 2026

(54) DISPLAY DEVICE

(71) Applicant: LG ELECTRONICS INC., Seoul (KR)

(72) Inventors: Jihyo Yoon, Seoul (KR); Sanghoon Kim, Seoul (KR); Seokwoo Kwon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/824,743

(22) Filed: Sep. 4, 2024

(65) Prior Publication Data

US 2024/0431052 A1 Dec. 26, 2024

Related U.S. Application Data

(63) Continuation of application No. 17/790,824, filed as application No. PCT/KR2020/000199 on Jan. 6, 2020, now Pat. No. 12,114,445.

(51) Int. Cl.
*H05K 5/02* (2006.01)
*H05K 9/00* (2006.01)

(52) U.S. Cl.
CPC ......... *H05K 5/0221* (2013.01); *H05K 9/0054* (2013.01)

(58) Field of Classification Search
CPC ...................................................... H05K 5/13
See application file for complete search history.

(56) References Cited

U.S. PATENT DOCUMENTS

| 7,956,979 B2 | 6/2011 | Oh et al. |
| 7,969,720 B2 | 6/2011 | Zhang |
| 8,172,097 B2 | 5/2012 | Nearman et al. |
| 2012/0039030 A1* | 2/2012 | Harita ............... H05K 5/03 361/679.01 |
| 2012/0163645 A1 | 6/2012 | Hwang et al. |
| 2018/0184534 A1 | 6/2018 | Na et al. |

FOREIGN PATENT DOCUMENTS

| KR | 10-2011-0080925 A | 7/2011 |
| KR | 10-1621794 B1 | 5/2016 |
| KR | 10-1758822 B1 | 7/2017 |

* cited by examiner

*Primary Examiner* — Jerry Wu
(74) *Attorney, Agent, or Firm* — Birch, Stewart, Kolasch & Birch, LLP

(57) ABSTRACT

A display device can include a display panel, a module cover disposed at a rear of the display panel, a back cover covering the rear of the module cover, and a latch positioned between the module cover and the back cover and coupled to each of the module cover and the back cover. The module cover can include an elongated hole in which the latch is inserted, and a plurality of inner surfaces defining the hole. The plurality of inner surfaces can include a first inner surface disposed at one side in a longitudinal direction of the hole, and a second inner surface disposed opposite to the first inner surface with respect to the latch. The back cover can include a protrusion protruding from the back cover toward the module cover to be coupled to the latch.

15 Claims, 20 Drawing Sheets

[FIG. 1]
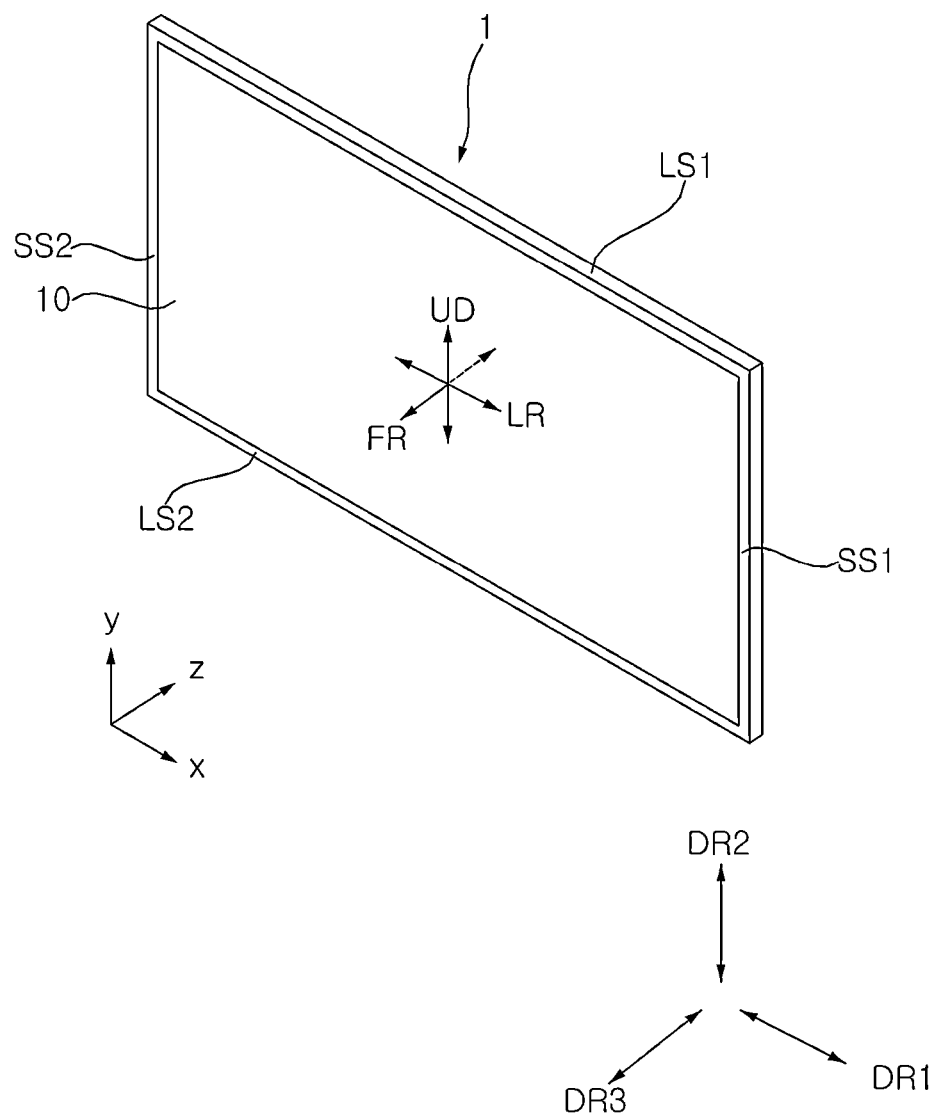

[FIG. 2]
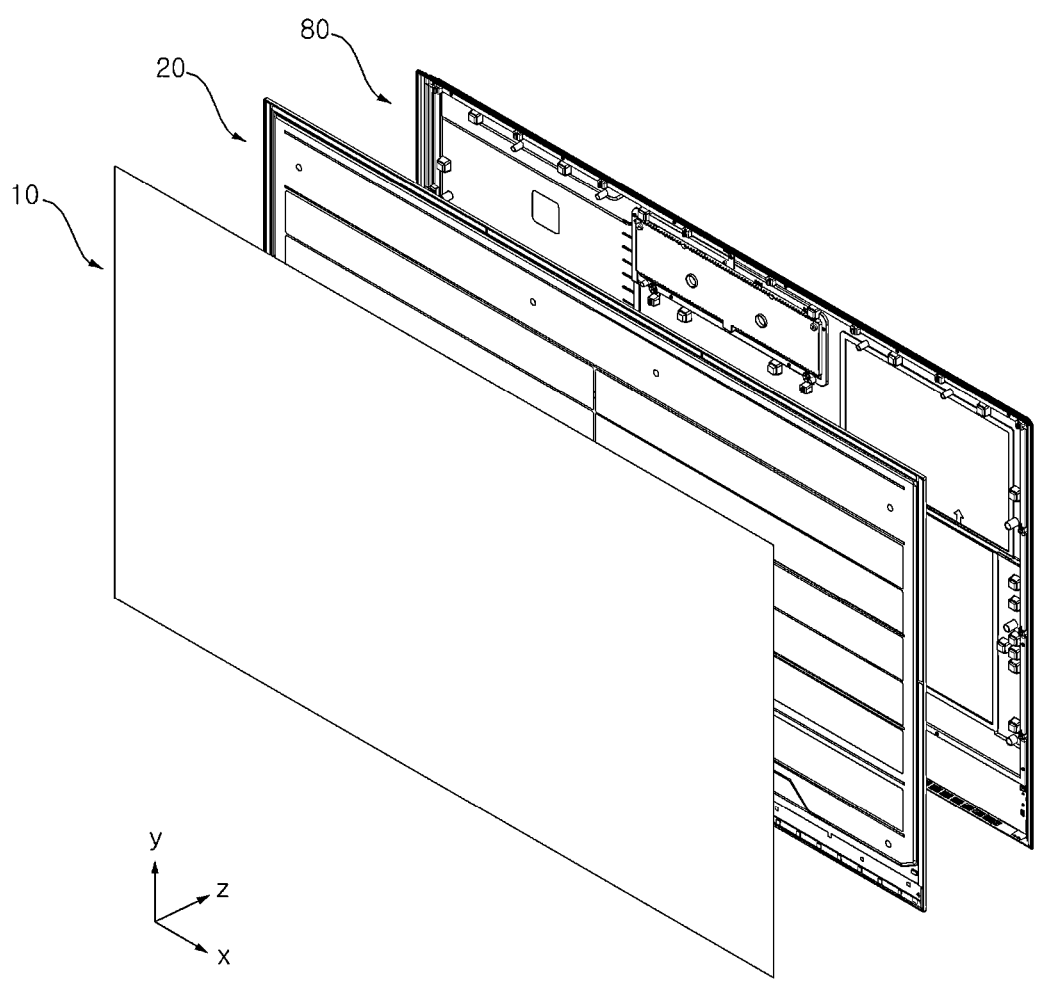

[FIG. 3]
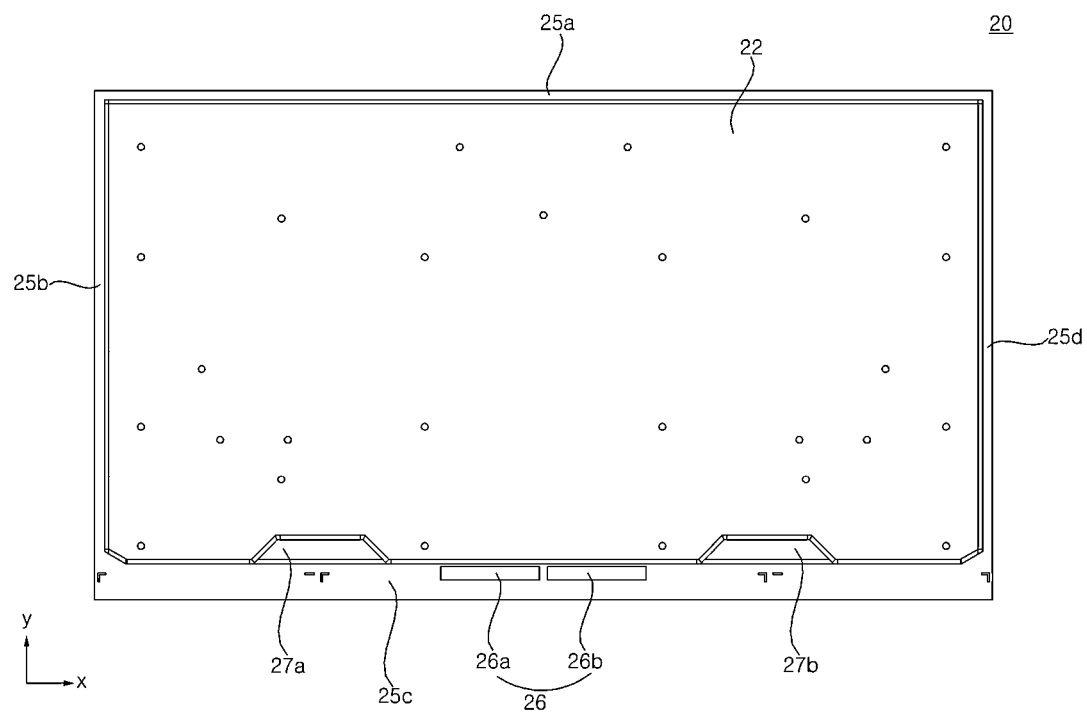

[FIG. 4]
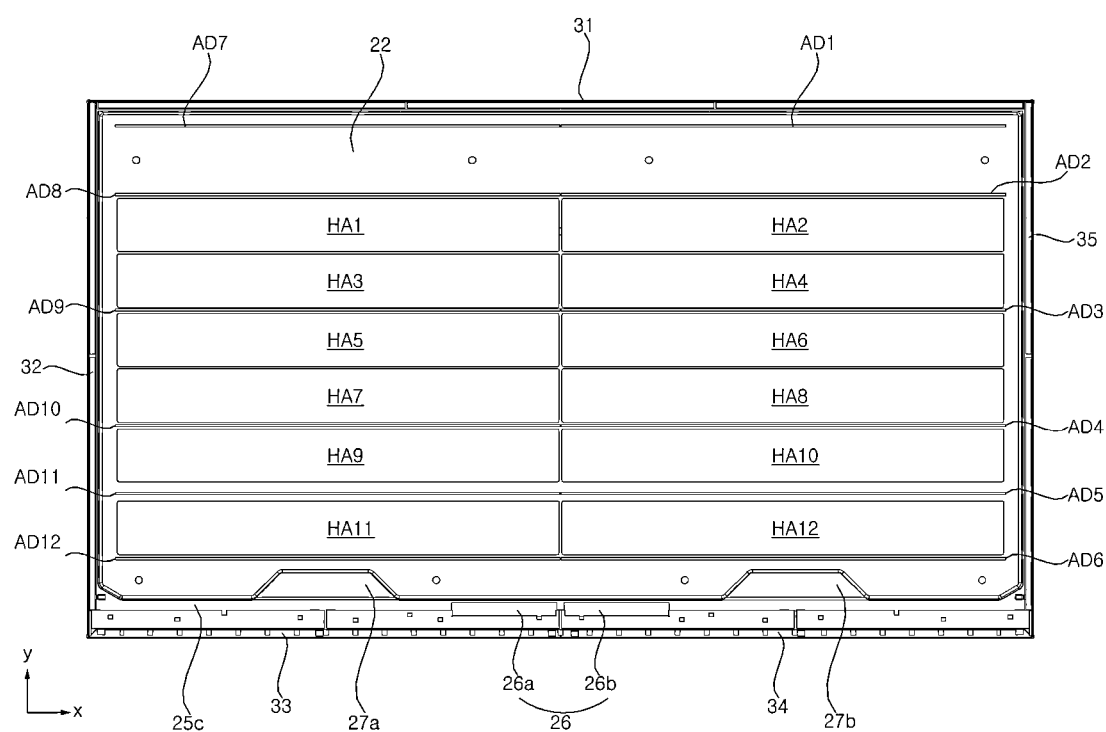

[FIG. 5]
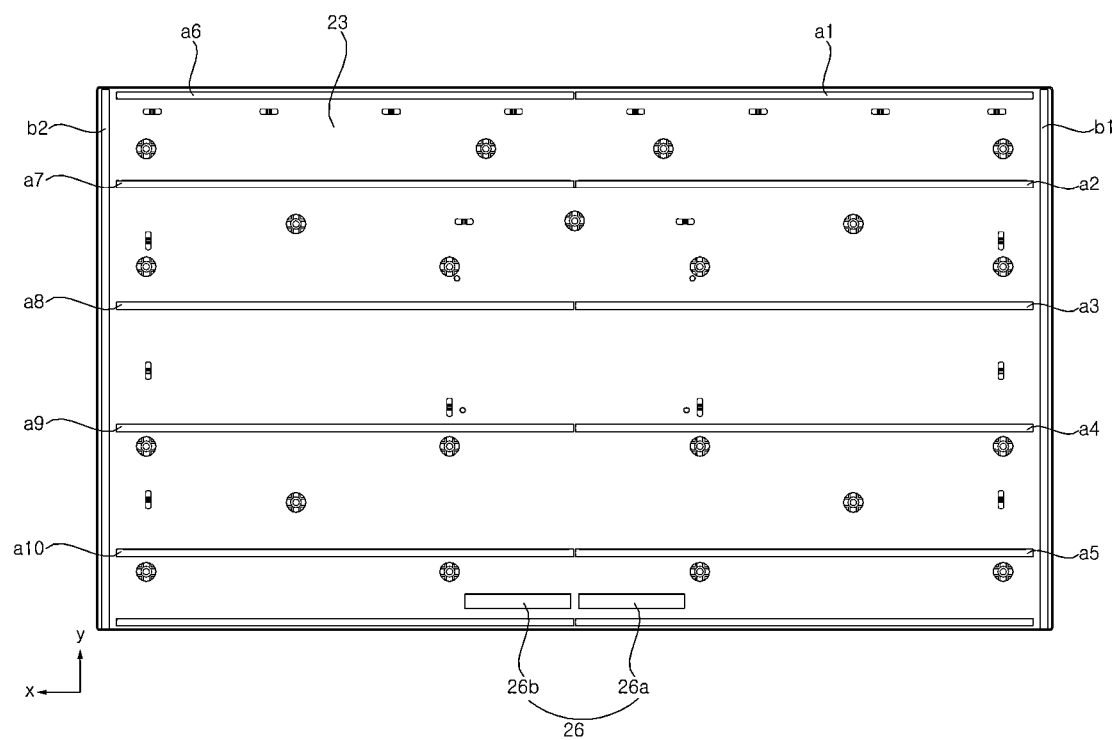

[FIG. 6]
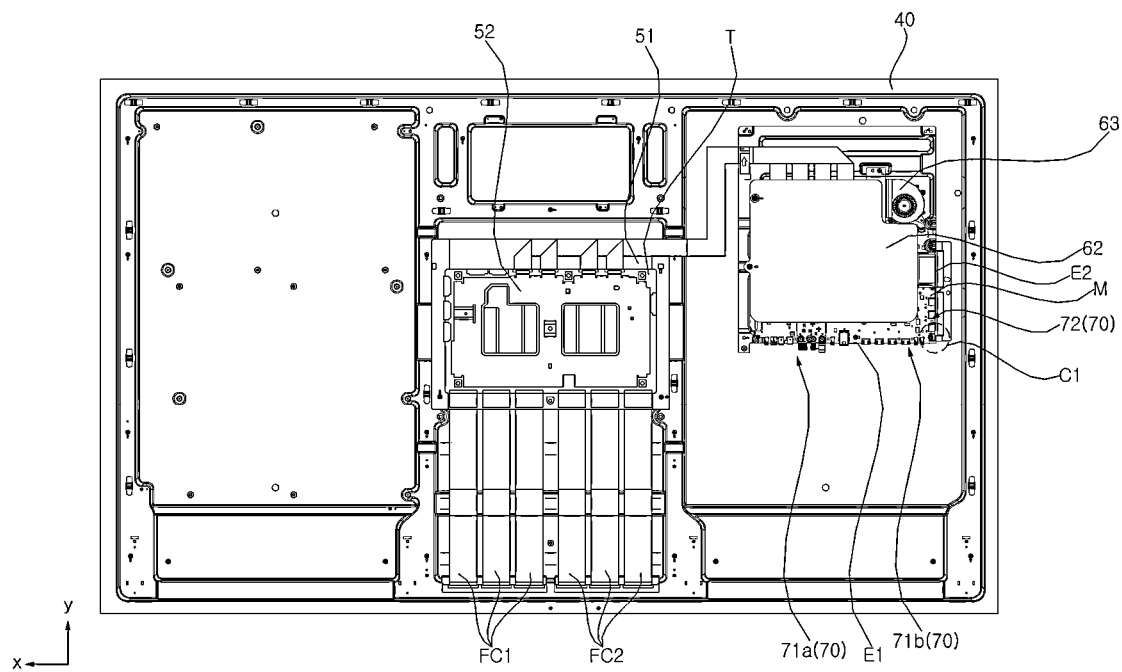

[FIG. 7]
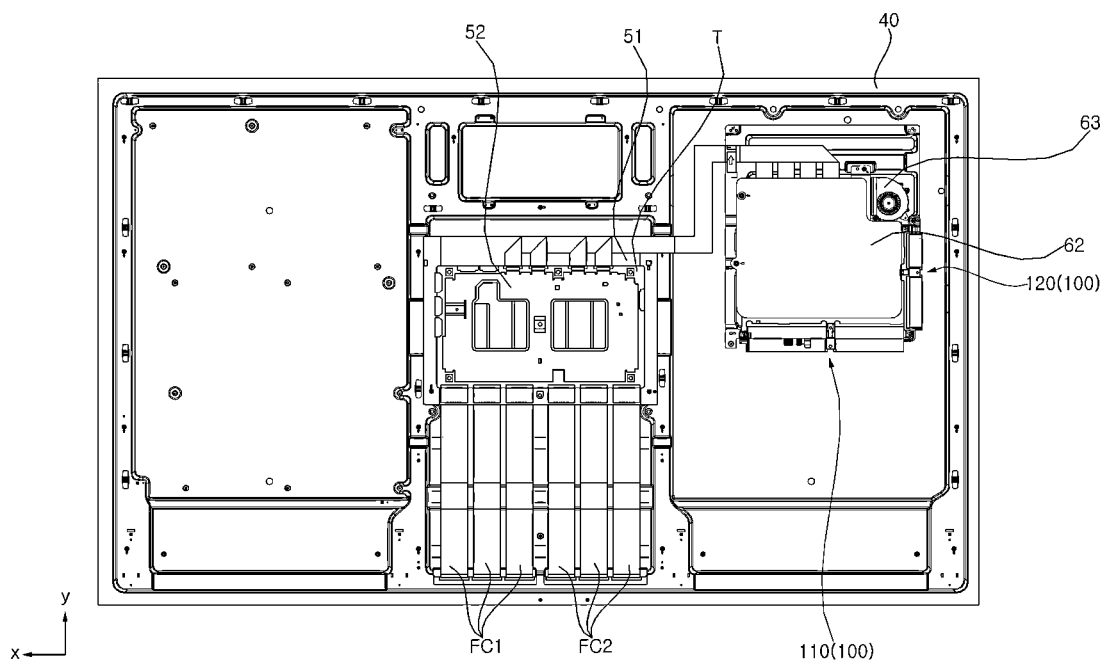

[FIG. 8]
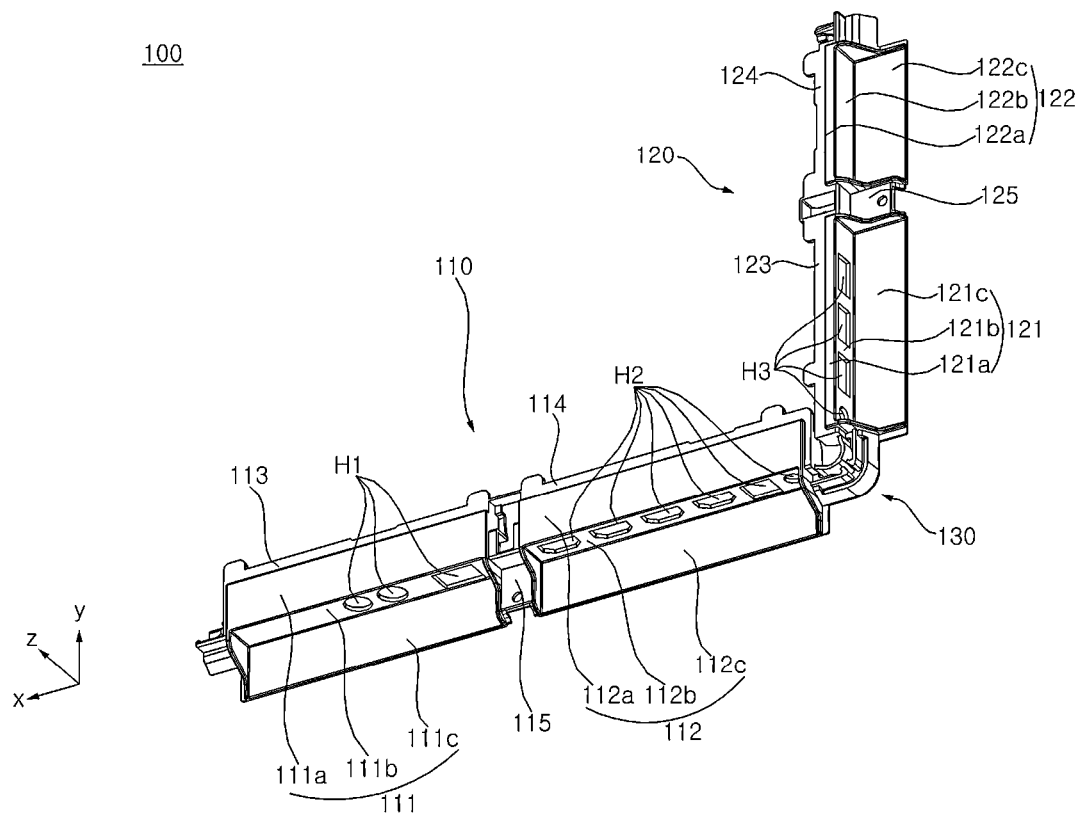

[FIG. 9]
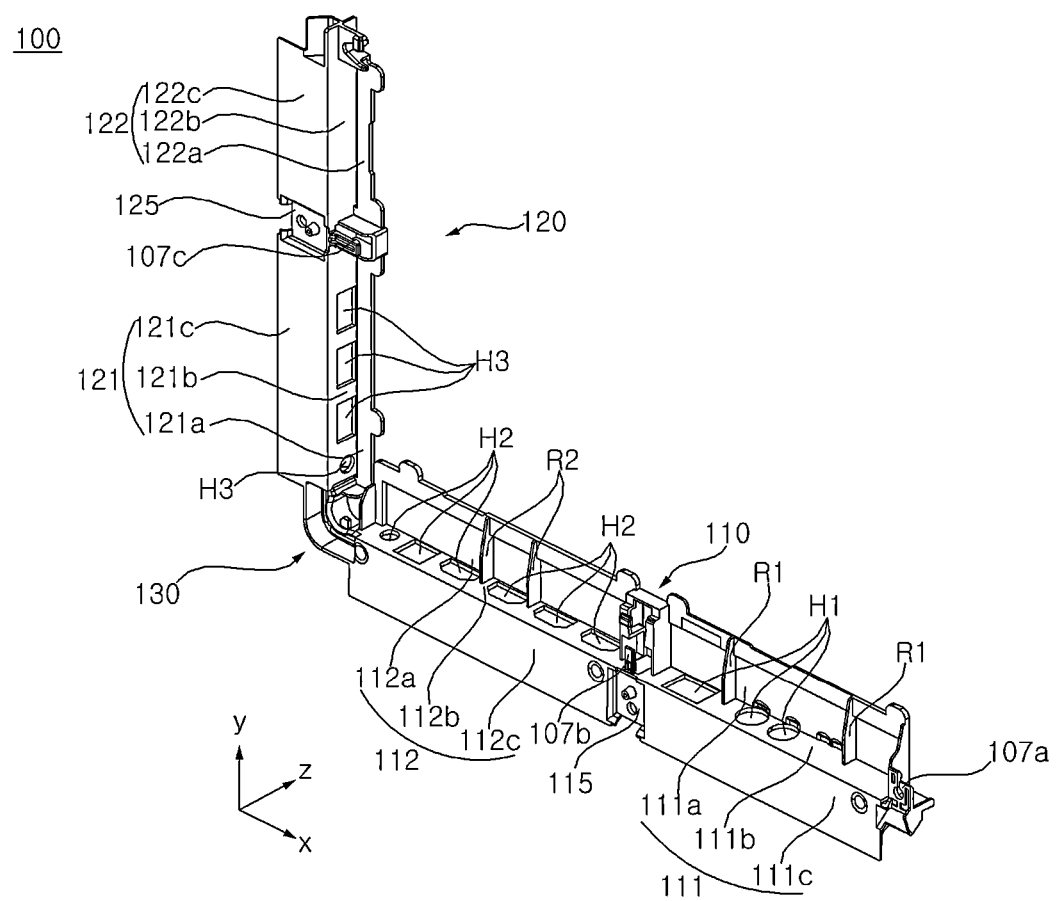

[FIG. 10]
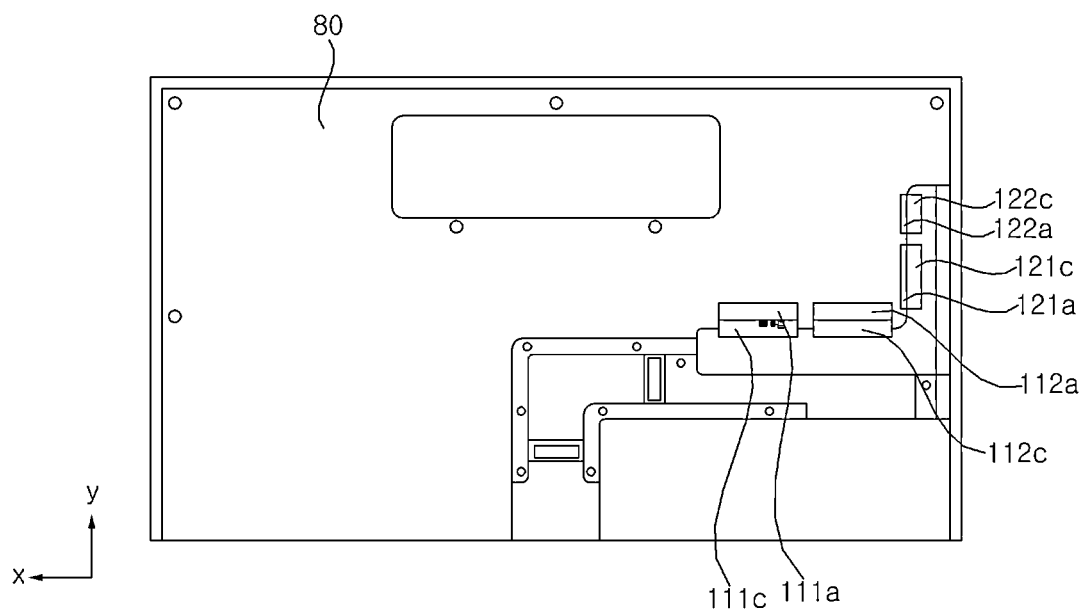

[FIG. 11]
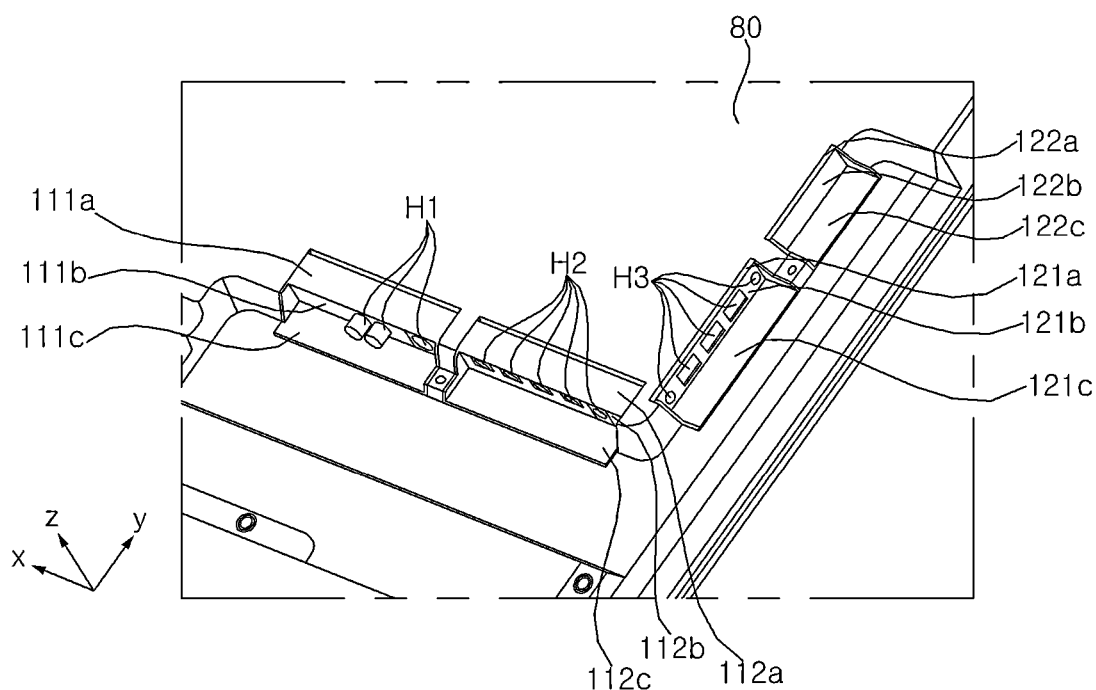

[FIG. 12]
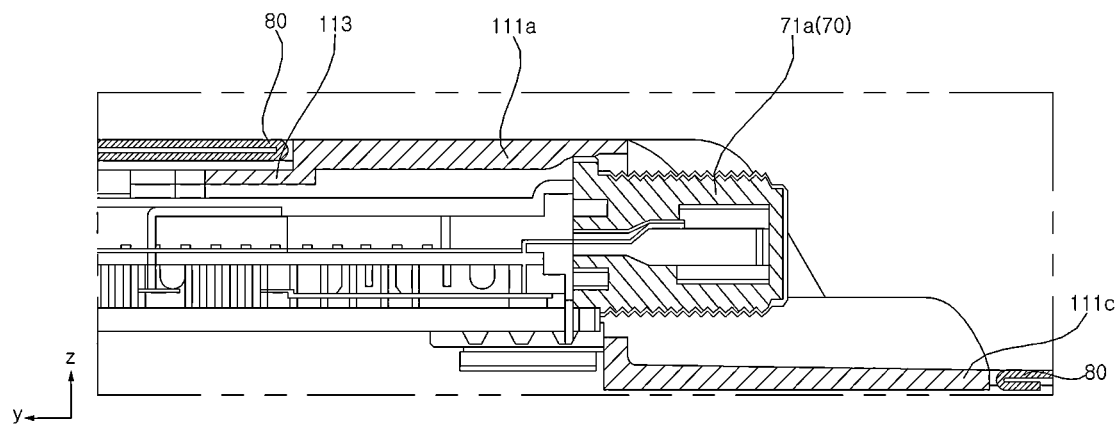

[FIG. 13]
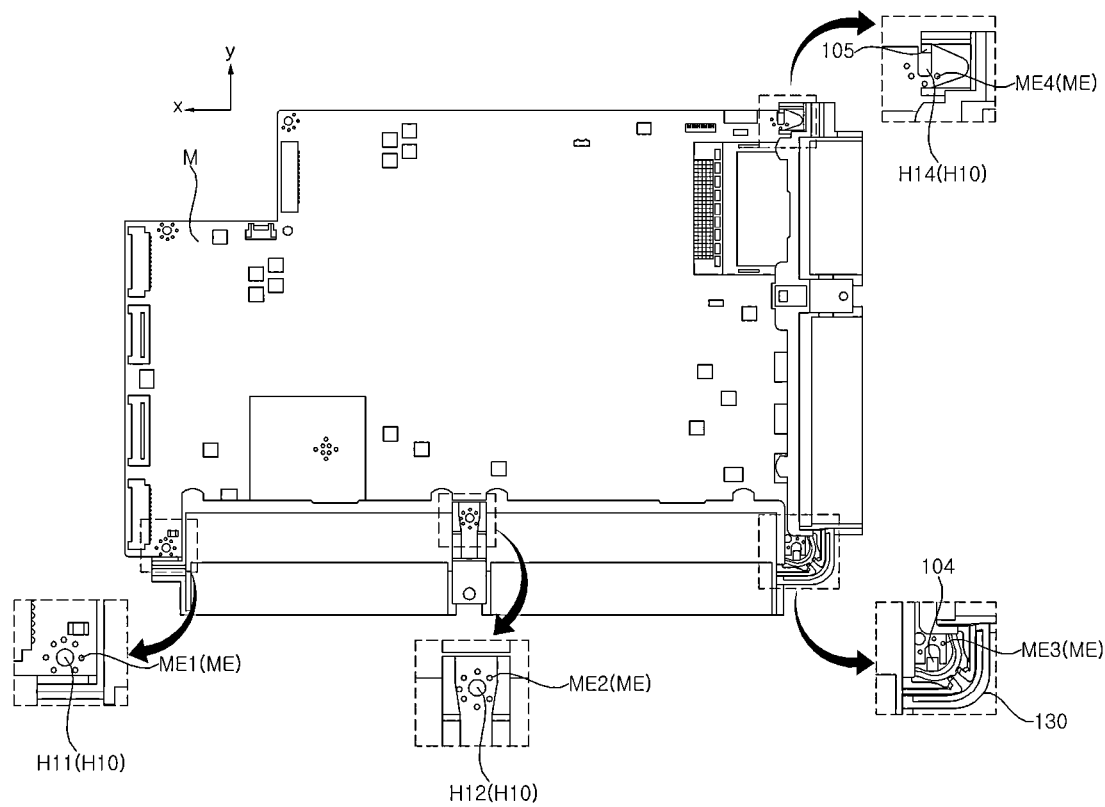

[FIG. 14]
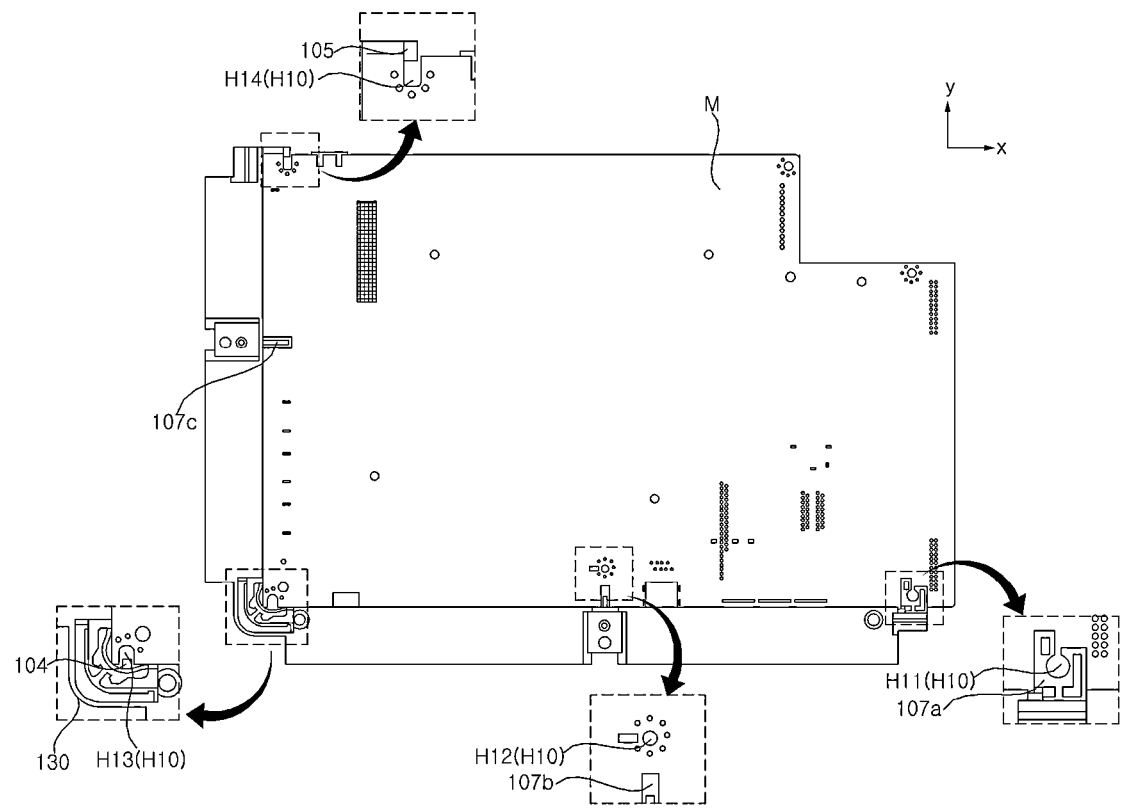

[FIG. 15]
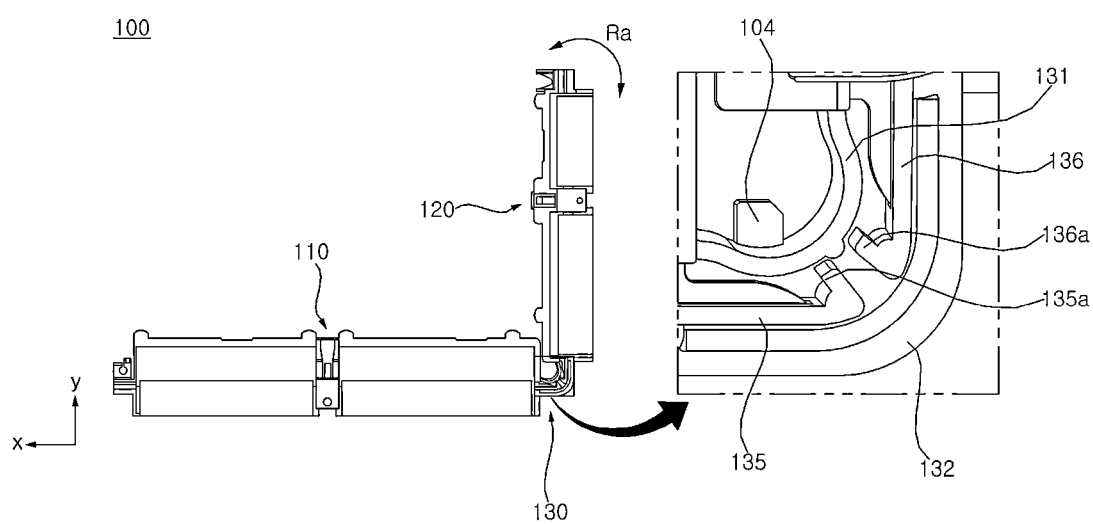

[FIG. 16]
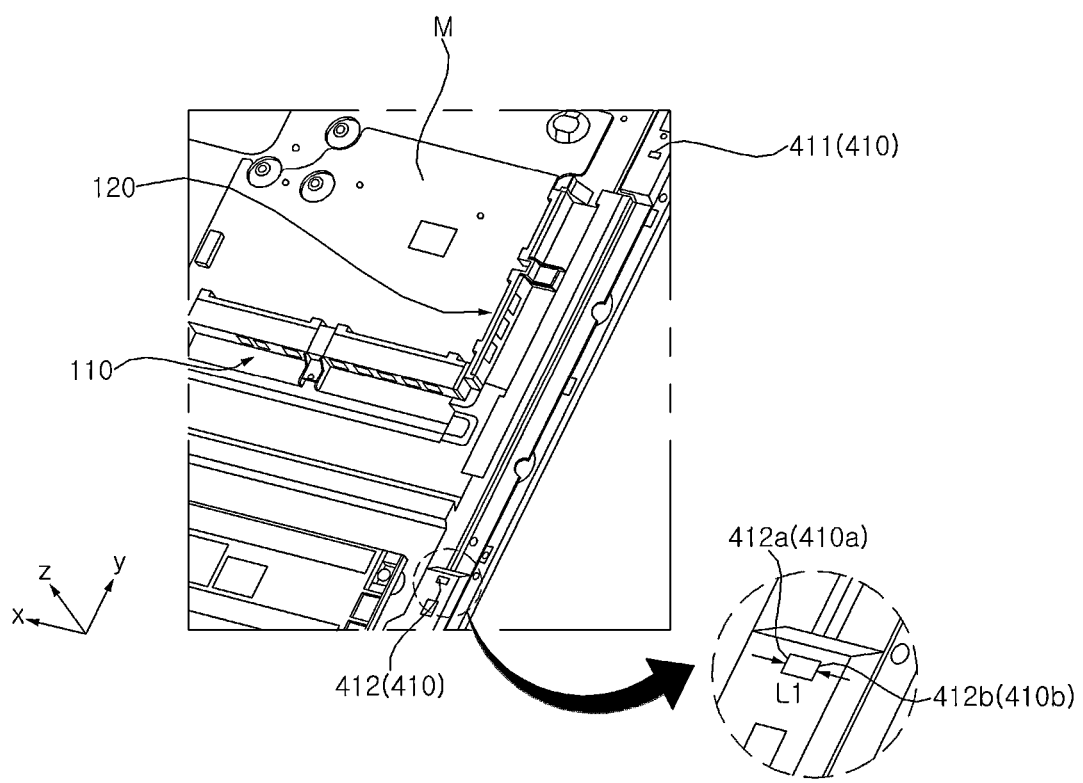

[FIG. 17]
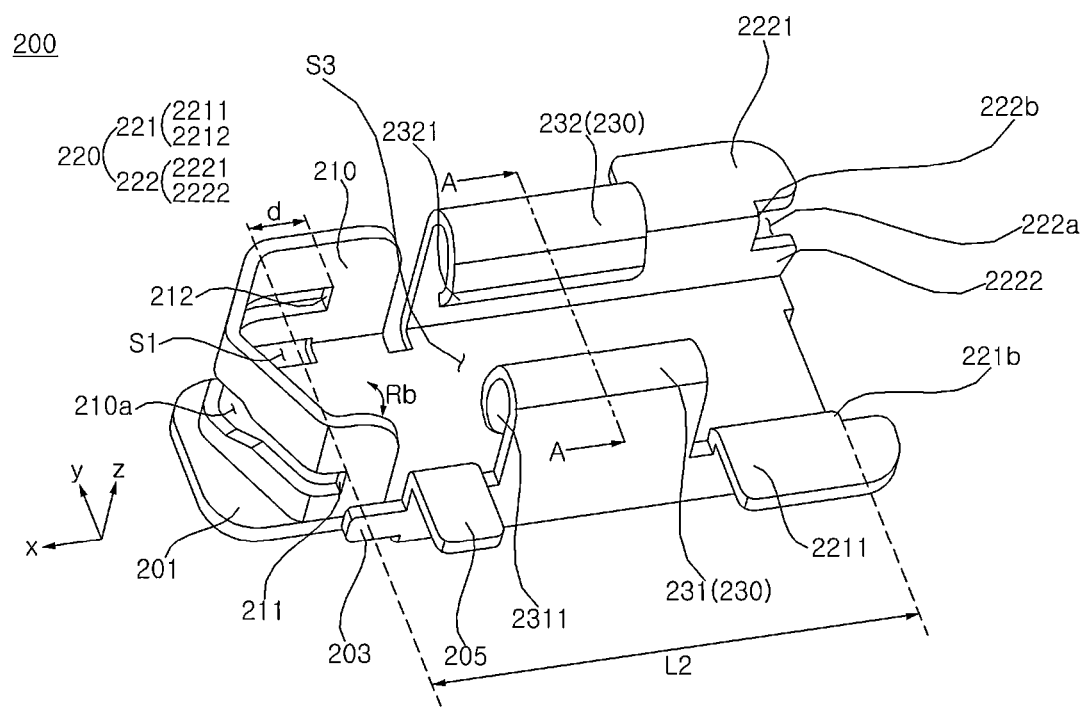

[FIG. 18]
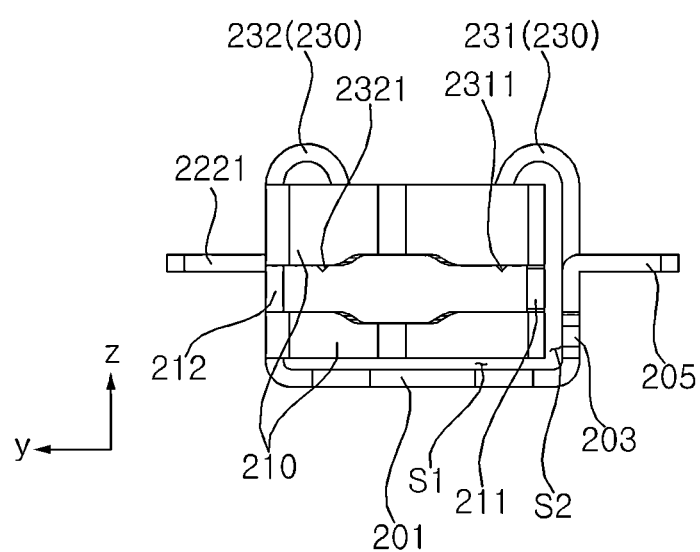

[FIG. 19]
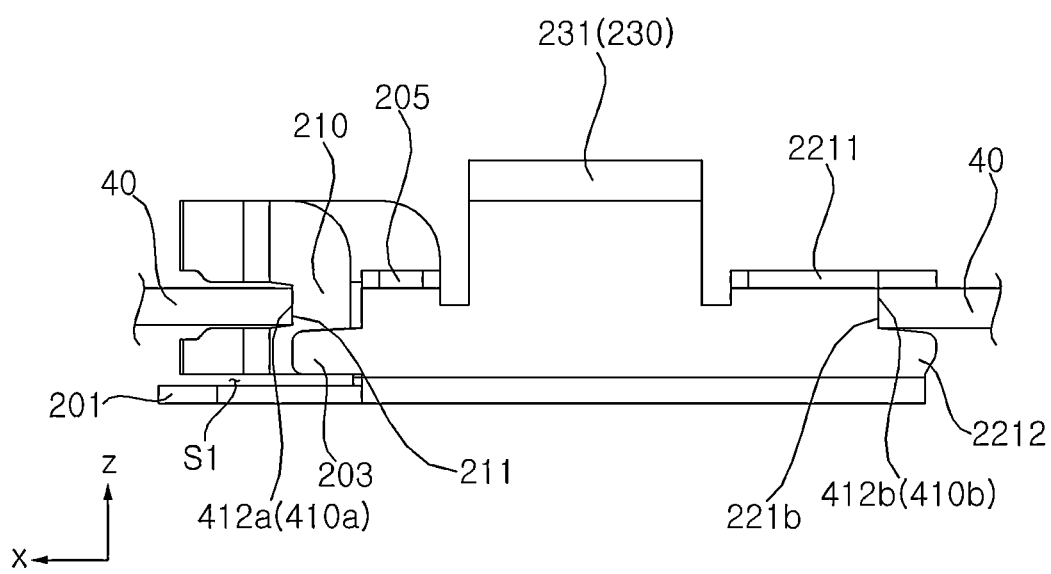

【FIG. 20】
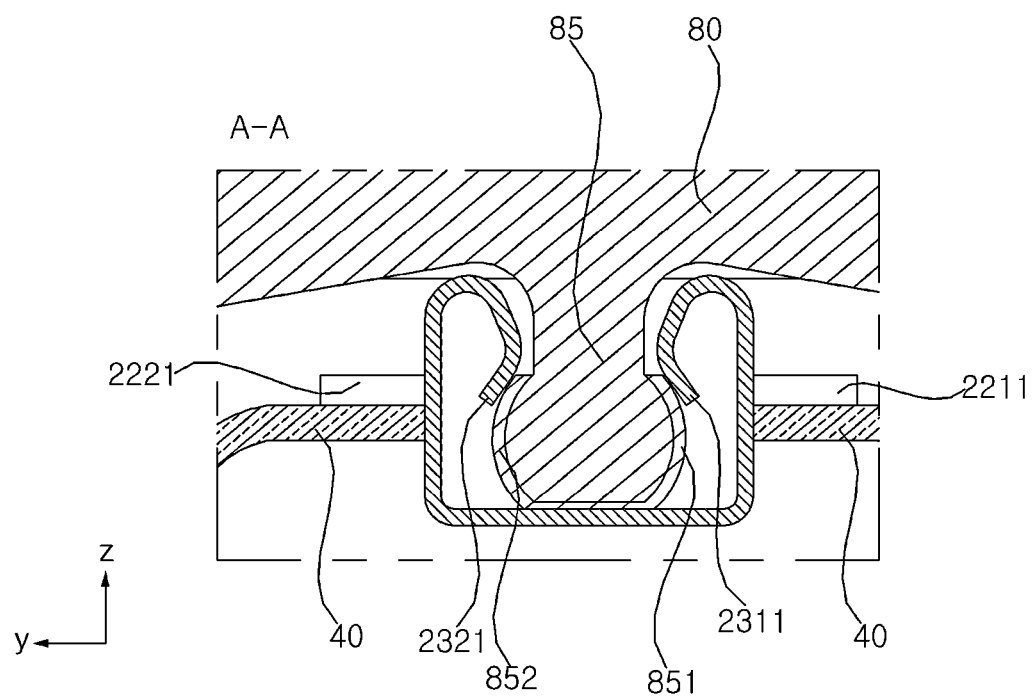

DISPLAY DEVICE

CROSS-REFERENCE TO RELATED APPLICATIONS

This application is a Continuation of U.S. patent application Ser. No. 17/790,824 filed on Jul. 5, 2022, which was filed as the National Phase of PCT International Application No. PCT/KR2020/000199, filed on Jan. 6, 2020, the entire contents of all these applications being hereby expressly incorporated by reference into the present application.

BACKGROUND

Field

The present disclosure relates to a display device.

Discussion of the Related Art

With the development of the information society, there have been growing demands for various types of display devices, and in order to meet these demands, research has been conducted thereon and various display devices have been used recently, including a liquid crystal display (LCD), a plasma display panel (PDP), an electroluminescent display (ELD), a vacuum fluorescent display (VFD), and the like.

Among them, a display device using an organic light emitting diode (OLED) has excellent luminance and viewing angle characteristics in comparison with a liquid crystal display device, and requires no backlight unit, such that the OLED display device can be implemented as an ultrathin display device.

In addition, according to recent development and consumption trends of the display device, a lot of research has been done to manufacture the display device with a thinner and lighter structure.

SUMMARY OF THE DISCLOSURE

It is an object of the present disclosure to solve the above and other problems.

It is another object of the present disclosure to provide a display device capable of being manufactured as a thin display device in which a bracket, covering a plurality of input/output units, forms a rear surface along with a back cover.

It is yet another object of the present disclosure to provide a display device capable of preventing formation of sharp edges at an end of the back cover adjacent to the bracket.

It is still another object of the present disclosure to provide a display device, in which two brackets are integrally formed with each other, thereby facilitating manufacture and maintenance thereof, and the brackets may be stably coupled or decoupled to a board.

It is still another object of the present disclosure to provide a display device capable of being manufactured as a thin display device, in which a protrusion and a latch for coupling a module cover and a back cover are coupled by overlapping each other.

In accordance with an aspect of the present disclosure, the above and other objects can be accomplished by providing a display device including: a display panel; a module cover disposed at a rear of the display panel; a back cover disposed at the rear of the module cover and coupled to the module cover; a board coupled to the module cover at a position between the module cover and the back cover, and having a plurality of input/output units; and a bracket adjacent to the plurality of input/output units and covering a portion of the board, wherein an end of the back cover is adjacent to the bracket.

The display device according to the present disclosure has the following effects.

According to at least one of the embodiments of the present disclosure, it is possible to provide a display device capable of being manufactured as a thin display device in which a bracket, covering a plurality of input/output units, forms a rear surface along with a back cover.

According to at least one of the embodiments of the present disclosure, it is possible to provide a display device capable of preventing formation of sharp edges at an end of the back cover adjacent to the bracket.

According to at least one of the embodiments of the present disclosure, it is possible to provide a display device, in which two brackets are integrally formed with each other, thereby facilitating manufacture and maintenance thereof, and the brackets may be stably coupled or decoupled to a board.

According to at least one of the embodiments of the present disclosure, it is possible to provide a display device capable of being manufactured as a thin display device, in which a protrusion and a latch for coupling a module cover and a back cover are coupled by overlapping each other.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF THE DRAWINGS

FIGS. 1 to 20 are diagrams illustrating examples of a display device according to embodiments of the present disclosure.

DETAILED DESCRIPTION OF THE EMBODIMENTS

Hereinafter, the present disclosure will be described in detail with reference to the accompanying drawings, in which the same reference numerals are used throughout the drawings to designate the same or similar components, and a redundant description thereof will be omitted.

The terms "module" and "unit" for elements used in the following description are given simply in view of the ease of the description, and do not have a distinguishing meaning or role.

Further, it will be noted that a detailed description of known arts will be omitted if it is determined that the detailed description of the known arts can obscure the embodiments of the invention. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc., may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the singular forms are intended to include the plural forms as well, unless the context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIG. 1, a display device 1 may include a display panel 10. The display panel 10 may display images.

The display device 1 may include a first long side LS1, a second long side LS2 opposite to the first long side LS1, a first short side SS1 adjacent to the first long side LS1 and the second long side LS2, and a second short side SS2 opposite to the first short side SS1. Meanwhile, for convenience of explanation, it is illustrated and described that the first and second long sides LS1 and LS2 are longer than the first and second short sides SS1 and SS2, but there may also be a case in which lengths of the first and second long sides LS1 and LS2 may be approximately equal to lengths of the first and second short sides SS1 and SS2.

A direction parallel to the first and second long sides LS1 and LS2 of the display device 1 may be referred to as a first direction DR1 or a left-right direction LR. A direction parallel to the first and second short sides SS1 and SS2 of the display device 1 may be referred to as a second direction DR2 or an up-down direction UD. A direction perpendicular to the long sides LS1 and LS2 and the short sides SS1 and SS2 of the display device 1 may be referred to as a third direction DR3 or a front-rear direction FR. Here, a side on which the display panel 10 displays an image may be referred to as a front side, and a side opposite thereto may be referred to as a rear side.

In the following description of the display panel 10, a display panel using an Organic Light Emitting Diode (OLED) will be described as an example, but the display panel 10 which may be applied to the present disclosure is not limited thereto.

Referring to FIG. 2, the display device 1 may include the display panel 10, an inner panel 20, and a back cover 80.

The display panel 10 may form a front surface of the display device 1 and may display an image on the front side. The display panel 10 may divide the image into a plurality of pixels and may output the image while controlling color, brightness, and chroma of the respective pixels. The display panel 10 may be divided into an active area, in which the image is displayed, and a de-active area in which the image is not displayed. The display panel 10 may generate light corresponding to red, green, or blue color in response to a control signal.

The inner panel 20 may be disposed at the rear of the display panel 10 and may be coupled to the display panel 10. For example, the inner panel 20 may have an overall rectangular shape. For example, the inner panel 20 may be formed of a metal material. The inner panel 20 may improve bending rigidity and/or torsional rigidity of the display device 1.

The back cover 80 may form a rear surface of the display device 1. The back cover 80 may be disposed at the rear of the inner panel 20. For example, a module cover 40, which will be described below, may be disposed between the back cover 80 and the inner panel 20. In this case, the back cover 80 is disposed at the rear of the module cover 40 and may be coupled to the module cover 40.

Referring to FIG. 3, the inner panel 20 may include a front skin 22 forming a front surface thereof. Further, pressing parts 25: 25a, 25b, 25c, and 25d may be formed on a circumference of the front skin 22. A first pressing part 25a and a third pressing part 25c may be formed along an upper side and a lower side of the front skin 22, and a second pressing part 25b and a fourth pressing part 25d may be formed along a right side and a lower side of the front skin 22. For example, the pressing part 25 may be formed as the front skin 22 is pressed. In this case, the pressing part 25 may be lowered from the front skin 22, thereby forming a step.

A cable hole 26 may be formed by passing through the third pressing part 25c, and a rear skin 23 (see FIG. 5) which will be described later. The cable hole 26 may be formed in the third pressing part 25c at a position adjacent to the lower side of the front skin 22. For example, the cable hole 26 may include a plurality of cable holes 26a and 26b. In this case, a first cable hole 26a and a second cable hole 26b may be disposed adjacent to each other.

A receiving part 27 may be formed adjacent to the lower side of the front skin 22. For example, the receiving part 27 may include a plurality of receiving parts 27a and 27b. The receiving part 27 may be formed as the front skin 22 is pressed. In this case, the receiving part 27 may be lowered from the front skin 22, thereby forming a step. In addition, the receiving part 27 may be raised from the pressing part 25, thereby forming a step.

Referring to FIGS. 3 and 4, a side frame 30 may be coupled to the pressing part 25. The side frame 30 may form side surfaces of the display device 1.

The side frame 30 may include a first part 31, a second part 32, a third part 33, a fourth part 34, and a fifth part 35. In this case, the first part 31 may be coupled to the first pressing part 25a, the second part 32 may be coupled to the second pressing part 25b, the third part 33 and the fourth part 34 may be coupled to the third pressing part 25c, and the fifth part 35 may be coupled to the fourth pressing part 25d.

A heat-dissipating plate HA may be elongated and coupled to the front skin 22. For example, the heat-dissipating plate HA may be a plate made of aluminum. In another example, the heat-dissipating plate HA may be a tape made of aluminum. For example, the heat-dissipating plate HA may include a plurality of heat-dissipating plates HA1, HA2, HA3, HA4, HA5, HA6, HA7, HA8, HA9, HA10, HA11, and HA12.

A panel adhesive member AD may be elongated and coupled to the front skin 22. For example, the panel adhesive member AD may include a plurality of adhesive members AD1, AD2, AD3, AD4, AD5, AD6, AD7, AD8, AD9, AD10, AD11, and AD12. In this case, the inner panel 20 may be coupled to the rear surface of the display panel 10 by the panel adhesive member AD.

Referring to FIG. 5, the inner panel 20 may include the rear skin 23 forming a rear surface thereof. Further, as described above, the cable hole 26 may be formed at a position adjacent to the lower side of the rear skin 23.

Rear adhesive members a and b may be coupled to the rear skin 23. For example, the rear adhesive members a and b may include a plurality of rear adhesive members. The plurality of rear adhesive members may include first adhesive members a1, a2, a3, a4, a5, a6, a7, a8, a9, and a10 which are elongated in the left-right direction on the rear skin 23, and second adhesive members b1 and b2 which are elongated in the up-down direction on the rear skin 23.

The module cover 40 may be coupled to the rear skin 23 by the rear adhesive members a and b. In this case, the module cover 40 may be disposed at the rear of the display panel 10 at a position between the inner panel 20 and the back cover 80.

Referring to FIG. 6, a plurality of electronic components, which are operated in conjunction with operation of the display panel 10, may be coupled to the module cover 40. That is, a board M may be coupled to the module cover 40 at a position between the module cover 40 and the back cover 80. The plurality of electronic elements may be mounted on the board M. For example, the electronic elements may be an IC chip. For example, the board M may include a plurality of input/output units 70. For example, the plurality of input/output units 70 may include video and/or audio input/output terminals, a USB port, a power input terminal, and the like.

A T-CON board T may be coupled to the module cover 40. The T-CON board T may be disposed on the first plate 51. The T-CON board T may be covered by a second plate 52. Further, FFC cables FC1 and FC2, which are connected to the display panel 10 via the cable hole 26 (see FIGS. 3 and 4), may be connected to the T-CON board T.

Meanwhile, a fan 63 may be installed on the board M and may generate an airflow for cooling the electronic elements mounted on the board M. Further, a plate 62 may partially cover the board M.

Referring to FIGS. 6 and 7, each of the plurality of input/output units 70 may be formed in at least any one of the up-down direction and the left-right direction. The plurality of input/output units 70 may include first input/output units 71a and 71b and a second input/output unit 72. The first input/output units 71a and 71b may be adjacent to a first edge E1 in any one of an upward direction and a downward direction, among edges of the board M. The second input/output unit 72 may be adjacent to a second edge E2 which is adjacent to the first edge E1 among the edges of the board M. For example, the first edge E1 may be a lower edge of the board M, and the second edge E2 may be a right edge of the board M.

That is, as the plurality of input/output units 70 are formed in the up-down direction and/or the left-right direction, it may be effective in decreasing the thickness of the display device 1 in the front-rear direction.

Meanwhile, the display device 1 may include a bracket 100 as a component for protecting the plurality of input/output units 70 from the outside. The bracket 100 may partially cover the board M at a position adjacent to the plurality of input/output units 70. For example, the bracket 100 may include a plastic material.

Referring to FIGS. 8 and 9, the bracket 100 may include a first bracket 110 covering at least partially the first input/output units 71a and 71b, and a second bracket 120 covering at least partially the second input/output unit 72.

The first bracket 110 may include a left bracket 111 and a right bracket 112. The left bracket 111 disposed on a left side of a first connector 115 and the right bracket 112 disposed on a right side of the first connector 115 may be integrally coupled to each other by the first connector 115.

The left bracket 111 may cover at least a portion of a left input/output unit 71a (see FIG. 6), which is disposed on the left side, of the first input/output units 71a and 71b. The right bracket 112 may cover at least a portion of a right input/output unit 71b (see FIG. 6), which is on the right side, of the first input/output units 71a and 71b.

Specifically, the left bracket 111 may include a first part 111a, a second part 111b, and a third part 111c. The first part 111a may cover a rear side of the left input/output unit 71a, and the third part 111c may be lowered below the first part 111a to form a step. The second part 111b may connect the first part 111a and the third part 111c, and may have holes H1 for guiding an external jack toward the left input/output unit 71a. In addition, the right bracket 112 may include a first part 112a, a second part 112b, and a third part 112c. The first part 112a may cover a rear side of the right input/output unit 71b, and the third part 112c may be lowered below the first part 112a to form a step. The second part 112b may connect the first part 112a and the third part 112c, and may have holes H2 for guiding an external jack toward the right input/output unit 71b.

The second bracket 120 may include a lower bracket 121 and an upper bracket 122. The lower bracket 121 disposed under the second connector 125 and the upper bracket 122 disposed over the second connector 125 may be integrally coupled to each other by the second connector 125.

The lower bracket 121 may cover at least a portion of the second input/output unit 72 (see FIG. 6). The upper bracket 122 may cover at least a portion of the board M. Alternatively, the upper bracket 122 may also cover at least a portion of the second input/output unit.

Specifically, the lower bracket 121 may include a first part 121a, a second part 121b, and a third part 121c. The first part 121a may cover a rear side of the second input/output unit 72, and the third part 121c may be lowered below the first part 121a to form a step. The second part 121b may connect the first part 121a and the third part 121c, and may have holes H3 for guiding an external jack toward the second input/output unit 72. In addition, the upper bracket 122 may include a first part 122a, a second part 122b, and a third part 122c. The first part 122a may cover a rear side of the board M, and the third part 122c may be lowered below the first part 122a to form a step. The second part 122b may connect the first part 122a and the third part 122c.

Meanwhile, a plurality of ribs R1 and R2 may be formed on each of a front surface of the first part 111a of the left bracket 111 and a front surface of the first part 112a of the right bracket 112. When the bracket 100 is coupled to the board M, the respective ribs R1 and R2 may be inserted into grooves (not shown) formed in the board M, to guide coupling of the bracket 100 to the board M and to increase a coupling force.

For example, the bracket 100 may be snap-fit coupled to the board M.

Referring to FIGS. 10 and 11, the back cover 80 may form at least a portion of the rear surface of the display device 1. For example, at least a portion of the rear surface of the display device 1 may be formed by the back cover 80, and a remaining portion thereof may be formed by the bracket 100. In this case, when the display device 1 is completely assembled, at least some of the first to third parts 111a, 111b, 111c; 112a, 112b, 112c; 121a, 121b, 121c; and 122a, 122b, 122c may be exposed to the outside. That is, a separate member for covering the rear side of the bracket 100 is omitted, such that it is effective in decreasing the thickness of the display device 1 in the front-rear direction in an area where the bracket 100 is disposed.

Meanwhile, in the back cover 80, a portion adjacent to the third parts 111c; 112c; 121c; and 122c of the bracket 100 is lowered below a portion adjacent to the first parts 111a; 112a; 121a; and 122a of the bracket 100, thereby forming a step. Accordingly, external jacks connected to the plurality of input/output units 70 may be easily connected.

For example, the back cover 80 may include a metal material.

Referring to FIGS. 11 and 12, an end of the back cover 80 may be adjacent to the bracket 100. For example, a portion of the back cover 80 may overlap with the bracket 100 in the front-rear direction. In this case, the first bracket 110 may include first overlapping portions 113 and 114 which are covered by the back cover 80, and the second bracket 120 may include second overlapping portions 123 and 124 which are covered by the back cover 80 (see FIG. 8). Further, the first connector 115 and the second connector 125 may also be covered by the back cover 80. In addition, a bridge 130 which will be described below may also be covered by the back cover 80.

For example, the first overlapping portions 113 and 114 are lowered below the left bracket 111 and the right bracket 112, thereby forming a step. For example, the second overlapping portions 123 and 124 are lowered below the lower bracket 121 and the upper bracket 122, thereby forming a step.

The end of the back cover 80 is bent such that a surface facing the bracket 100 may be curvedly formed. For example, the end of the back cover 80 may be adjacent to the first part 111*a* while covering the first overlapping portion 113. The end of the back cover 80 is bent inwardly and folded, such that a surface facing the first part 111*a* may be curvedly formed. For example, the end of the back cover 80 may be adjacent to the third part 111*c* while covering a portion adjacent to the third part 111*c*. The end of the back cover 80 is bent inwardly and folded, such that a surface facing the third part 111*c* may be curved formed. Further, a description thereof may also apply to the end of the back cover 80 adjacent to the bracket 100.

Accordingly, it is possible to prevent sharp edges from being formed at the end of the back cover 80 adjacent to the bracket 100. That is, it is possible to prevent the sharp edge of the back cover 80 from harming a user's hand touching the rear surface of the display device 1.

Referring to FIGS. 13 and 14, a connector SC (not shown) may have one side coming into contact with the board M, and the other side coupled to a metal plate MP (not shown) for reducing noise. For example, the connector SC may be a screw. In this case, a portion of the connector SC, which corresponds to a head portion of the screw, may come into contact with a terminal ME exposed to the rear surface of the board M. Here, the terminal ME may be a conductive copper wire. In addition, a portion of the connector SC, which corresponds to a body portion having a screw thread formed therein, may be coupled to the metal plate MP.

Accordingly, noise of the plurality of electronic elements mounted on the board M may be reduced by the metal plate MP through the connector SC.

The board M may have a hole H10, into which the connector SC is inserted. The hole H10 may include a plurality of holes H11, H12, H13, and H14 which are spaced apart from each other. In addition, the plurality of holes H11, H12, H13, and H14 may include first holes H11 and H12 and second holes H13 and H14.

The first holes H11 and H12 may be formed by passing through the front surface and the rear surface of the board M from the inside of the board M. In this case, first connectors SC1 and SC2 of the connector SC may be restricted from moving in the up-down direction and/or left-right direction by the inner surface of the board M defining the first holes H11 and H12.

The second holes H13 and H14 may be formed by passing through the front surface and the rear surface of the board M from a circumferential surface of the board M. In addition, the bracket 100 may further include protrusions 104 and 105. Here, the protrusions 104 and 105 may protrude toward the second holes H13 and H14, and may provide a space, extending in the front-rear direction, along with the circumferential surface of the board M defining the second holes H13 and H14. In this case, second connectors SC3 and SC4 of the connector SC, which are inserted into the second holes H13 and H14, may be restricted from moving in the up-down direction and/or left-right direction by the circumferential surface of the board M defining the second holes H13 and H14 and the protrusions 104 and 105.

Meanwhile, the bracket 100 may further include supporters 107: 107*a*, 107*b*, and 107*c* (see FIG. 9). The supporter 107 may protrude toward the board M to support the board M. The supporter 107 may be disposed opposite to one side of the connector SC coming into contact with the board M, with the board M being disposed therebetween. For example, one side of the connector SC (e.g., a portion corresponding to the head portion of the screw) may come into contact with the rear surface of the board M, and the supporter 107 may come into contact with the front surface of the board M. Accordingly, the supporter 107 may stably support coupling of the bracket 100 to the board M.

For example, the supporter 107 may include a plurality of supporters 107*a*, 107*b*, and 107*c* which are spaced apart from each other. In this case, the plurality of supporters 107*a*, 107*b*, and 107*c* may include first supports 107*a* and 107*b* protruding from the first bracket 110, and a second supporter 107*c* protruding from the second bracket 120. That is, the first supporters 107*a* and 107*b* and the second supporter 107*c* are disposed perpendicular to each other, such that the supporter 107 may support the board M more stably.

Furthermore, in addition to supporting the board M, the supporter 107 may also be hooked to the board M. Accordingly, a coupling force of the bracket 100 to the board M may increase by the supporter 107.

Referring to FIGS. 13 and 15, the bracket 100 may include a bridge 130 adjacent to the corner C1 (see FIG. 6), at which the first edge E1 and the second edge E2 meet, among the corners of the board M. The bridge 130 may connect the first bracket 110 and the second bracket 120. For example, the first bracket 110 and the second bracket 120 may be integrally connected by the bridge 130. Accordingly, it is possible to easily manufacture and/or maintain the bracket 100.

The bridge 130 may include a first bridge 131 and a second bridge 132. One side of the first bridge 131 may be coupled to the first bracket 110, and the other side thereof may be coupled to the second bracket 120. In addition, at least a portion of the first bridge 131 may be curvedly formed. One side of the second bridge 132 may be coupled to the first bracket 110, and the other side thereof may be coupled to the second bracket 120. In addition, at least a portion of the second bridge 132 may be curvedly formed.

The first bridge 131 and the second bridge 132 may include an elastic material. In this case, the second bracket 120 may be rotated with respect to the first bracket 110 in a direction closer to or away from the second edge E2. Here, the first bridge 131 and the second bridge 132 may not only connect the first bracket 110 and the second bracket 120, but also serve as a structure for securing rigidity to support rotation of the second bracket 120 with respect to the first bracket 110.

In addition, the rotation of the second bracket 120 with respect to the first bracket 110 may be performed about an axis in the front-rear direction. In this case, the rotation of the second bracket 120 with respect to the first bracket 110 is also performed about an axis in the up-down direction and/or the left-right direction, such that it is required to prevent twisting. Further, to this end, the first bridge 131 and the second bridge 132 may be spaced apart from each other. Accordingly, in order to couple the bracket 100 to the board M, a user may rotate the second bracket 120 in a direction away from the second edge E2, and then may couple the first bracket 110 to the first edge E1 of the board M (see FIG. 6). Then, by rotating the second bracket 120 in a direction closer to the second edge E2, the user may couple the second bracket 120 to the second edge E2 of the board M (see FIG. 6).

Further, the rotation of the second bracket 120 with respect to the first bracket 110 is performed about the axis in the front-rear direction, thereby allowing the user to easily couple or decouple the bracket 100 to the board M. In addition, unexpected twisting of the bracket 100 may be prevented, such that even when the bracket 100 is coupled or decoupled repeatedly, durability of the bridge 130 may be maintained.

Meanwhile, the bridge 130 may include a pair of stoppers 135 and 136 disposed between the first bridge 131 and the second bridge 132, and coupled to the first bracket 110 and the second bracket 120, respectively. In this case, while the pair of stoppers 135 and 136 are spaced apart from each other, as the second bracket 120 is rotated with respect to the first bracket 110 in a direction away from the second edge E2, the pair of stoppers 135 and 136 gradually move closer to each other to come into contact with each other at contact portions 135a and 136a.

Accordingly, in a process of coupling or decoupling the bracket 100 to the board M, it is possible to prevent damage of the second bracket 120 which occurs when the second bracket 120 is excessively rotated with respect to the first bracket 110 in a direction away from the second edge E2.

Referring to FIGS. 16 and 17, the display device 1 may include a latch 200 coupled to each of the module cover 40 and the back cover 80 at a position between the module cover 40 and the back cover 80. That is, the back cover 80 may be coupled to the module cover 40 by the latch 200.

The module cover 40 may provide a space 410 in which the latch 200 is inserted. For example, there may be a plurality of latches 200 and spaces 410 (411, 412). The module cover 40 may include a plurality of inner surfaces defining the space 410, and the space 410 may be elongated. In this case, the plurality of inner surfaces may include a first inner surface 410a disposed at one side in a longitudinal direction of the space 410, and a second inner surface 410b disposed opposite to the first inner surface 410a with the latch 200 being disposed therebetween.

When the latch 200 is coupled to the module cover 40, a portion of the latch 200 may be divided into a front portion and a rear portion with respect to a virtual plane connecting the first inner surface 410a and the second inner surface 410b. That is, only a portion of the latch 200 may be inserted into the space 410 and fixed thereto, which will be described below in detail.

Referring to FIGS. 17 and 18, the latch 200 may include a first part 210, a second part 220, and a third part 230.

The first part 210 may receive the inner surface 410a therein. Specifically, the first part 210 may have an opening 210a formed on one side, and the first part 210 may access the first inner surface 410a through the opening 210a.

Further, the first part 210 may include a first contact surface 211 which comes into contact with the first inner surface 410a, and to which a force for elastic deformation of the first part 210 is applied. In addition, the first part 210 may include a guide surface 212 facing the first inner surface 410a at a distance. As the first part 210 is elastically deformed by the force applied to the first contact surface 211, the guide surface 212 may be gradually moved closer to the first inner surface 410a (i.e., a distance d between the first contact surface 211 and the guide surface 212 decreases in the left-right direction), and may come into contact therewith. As a result, the guide surface 212 may limit the elastic deformation of the first part 210 to a predetermined range.

The second part 220 may receive a second inner surface 410b therein. Specifically, the second part 220 may include a pair of second parts 221 and 222 which are spaced apart from each other. In this case, the pair of second parts 221 and 222 may have openings 221a and 222a formed on one side, and the pair of second parts 221 and 222 may access the second inner surface 410b through the openings 221a and 222a.

Further, the pair of second parts 210 may include second contact surfaces 221b and 222b coming into contact with the second inner surface 410b.

A third part 230 may be disposed between the first part 210 and the second part 220. The third part 230 may face a protrusion 85 (see FIG. 20). Here, the protrusion 85 may protrude from the back cover 80 toward the module cover 40, to be coupled to the latch 200.

Meanwhile, the first part 210, the second part 220, and the third part 230 may be formed on a latch body 201 of the latch 200. Here, a portion of the first part 210 is connected to the latch body 201, but a remaining portion thereof is spaced apart from the latch body 201, thereby forming a first space S1 with the latch body 201. Further, the first part 210 is spaced apart from an auxiliary part 203 having a seating portion 205 formed therein which will be described later, thereby forming a second space S2 with the auxiliary part 203. In addition, a portion of the first part 210, which is connected to the latch body 201, may be adjacent to the guide surface 212, and a portion of the first part 210, which faces the auxiliary part 203, may be adjacent to the first contact surface 211.

Accordingly, with the portion connected to the latch body 201 being fixed, the first part 210 may be rotated in a rotational direction Rb by the force applied to the first contact surface 211. For example, the first part 210 may include an elastic material.

Referring to FIGS. 17 and 19, in order to insert the latch 200 into the space 410, a user may first obliquely move the opening 210a toward the first inner surface 410a, so that the first inner surface 410a may come into contact with the first contact surface 211.

While being in contact with the first inner surface 410a, when the user continuously moves the first contact surface 211 toward the first inner surface 410a, the first part 210 is elastically deformed and may be rotated to one side in the rotational direction Rb. In this case, a distance d between the first inner surface 410a and the guide surface 212 gradually decreases, such that the first inner surface 410a and the guide surface 212 may come into contact with each other. Further, while the first inner surface 410a and the guide surface 410b are moved by the user to come into contact with each other, the user may adjust a position of the latch 200 so that the latch 200 may be disposed parallel to a virtual plane connecting the first inner surface 410a and the second inner surface 410b.

Then, when the force applied by the user to the first inner surface 410a is released, the first part 210 may be rotated to a side opposite to the one side in the rotational direction Rb, to be restored to an original shape. In this case, the second inner surface 410b is inserted into the openings 221a and 222a, such that the second contact surfaces 221b and 222b and the second inner surface 410b are gradually moved closer to each other to come into contact with each other. Here, a distance L2 between the first contact surface 211 and the second contact surface 221b and 222b may be equal to a length L1 (see FIG. 16) of the space 410 (412a, 412b).

Accordingly, the latch 200 may be inserted into the space 410 to be coupled to the module cover 40. In this case, each of the first part 210 and the second part 220 may come into contact with the front surface and the rear surface of the module cover 40. For example, the first part 210 may come into contact with the front surface and the rear surface of the module cover 40 inserted into the opening 210a. For example, the second part 220 may come into contact with the front surface and the rear surface of the module cover 40 inserted into the openings 221a and 222a.

In addition, along with the seating portion 205, portions 2211 and 2221 of the second part 220 may be formed in a wing shape on the latch 200, to come into contact with the rear surface of the module cover 40, thereby preventing the latch 200 from being separated forwardly.

Referring to FIGS. 17 and 20, the third part 230 may include a pair of third parts 231 and 232 which are spaced apart from each other to form a third space S3 (for reference, FIG. 20 is a cross-sectional view taken along line A-A of FIG. 17). In addition, the protrusion 85 may be inserted into the third space S3. In this case, the protrusion 85 may be disposed opposite to the module cover 40 with the latch 200 being disposed therebetween.

In addition, the pair of third parts 231 and 232 may include bending portions 2311 and 2321 which are formed by bending toward the inside of space 410. In this case, the protrusion 85 may include locking portions 851 and 852 which overlap with the bending portions 2311 and 2321 in the front-rear direction. Here, the bending portions 2311 and 2321 may include an elastic material, and the locking portions 851 and 852 may elastically deform the bending portions 2311 and 2321 and may be hooked to the bending portions 2311 and 2321.

Accordingly, the latch 200 and the protrusion 85 for connecting the module cover 40 and the back cover 80 are coupled to each other while overlapping each other, such that it is effective in decreasing the thickness of the display device 1 in the front-rear direction.

Meanwhile, after the module cover 40 and the back cover 80 are coupled to each other by using the latch 200 and the protrusion 85, the back cover 80 may be firmly fixed to the module 40 by using a separate fastening member such as a screw.

According to an aspect of the present disclosure, there is provided a display device including: a display panel; a module cover disposed at a rear of the display panel; a back cover disposed at the rear of the module cover and coupled to the module cover; a board coupled to the module cover at a position between the module cover and the back cover, and having a plurality of input/output units; and a bracket adjacent to the plurality of input/output units and covering a portion of the board, wherein an end of the back cover is adjacent to the bracket.

In addition, according to another aspect of the present disclosure, a portion of the back cover may overlap with the bracket in a front-rear direction.

In addition, according to another aspect of the present disclosure, the end of the back cover may be bent such that a surface facing the bracket may be curvedly formed.

In addition, according to another aspect of the present disclosure, each of the plurality of input/output units may be formed in at least any one of an up-down direction and a left-right direction.

In addition, according to another aspect of the present disclosure, the plurality of input/output units may include: a first input/output unit disposed adjacent to a first edge on any one side in the up-down direction among edges of the board; and a second input/output unit adjacent to a second edge adjacent to the first edge among the edges of the board, wherein the bracket may include: a first bracket covering at least a portion of the first input/output unit; and a second bracket covering at least a portion of the second input/output unit.

In addition, according to another aspect of the present disclosure, the bracket may further include a bridge disposed adjacent to a corner, at which the first edge and the second edge meet, among corners of the board, and connecting the first bracket and the second bracket.

In addition, according to another aspect of the present disclosure, the bridge may further include: a first bridge having one side coupled to the first bracket, the other side coupled to the second bracket, wherein at least a portion of the first bridge is formed to be curved; and a second bridge spaced apart from the first bridge, and having one side coupled to the first bracket, the other side coupled to the second bracket, wherein at least a portion of the second bridge is formed to be curved and the second bridge is spaced apart from the first bridge, wherein: the first bridge and the second bridge may include an elastic material; and the second bracket may be rotatable with respect to the first bracket in a direction closer to or away from the second edge.

In addition, according to another aspect of the present disclosure, the bridge may further include a pair of stoppers disposed between the first bridge and the second bridge, and coupled to the first bracket and the second bracket, respectively, wherein while the pair of stoppers are spaced apart from each other, as the second bracket is rotated with respect to the first bracket in a direction away from the second edge, the pair of stoppers may be gradually moved closer to each other to come into contact with each other.

In addition, according to another aspect of the present disclosure, there may be further included a connector having one side that contacts the board and the other side coupled to a metal plate for reducing Electro Magnetic Interference (EMI) noise, wherein the board may have a hole into which the connector is inserted.

In addition, according to another aspect of the present disclosure, the hole may include a plurality of holes which are spaced apart from each other, wherein the plurality of holes may include: a first hole formed by passing through a front surface and a rear surface of the board from an inside of the board; and a second hole formed by passing through the front surface and the rear surface of the board from a circumferential surface of the board, wherein the bracket may further include a protrusion protruding toward the second hole, and providing a space, which extends in the front-rear direction, along with the circumferential surface of the board which has the second hole formed therein.

In addition, according to another aspect of the present disclosure, the bracket may further include a supporter protruding toward the board to support the board, and disposed opposite to one side of the connector that contacts the board with the board being disposed therebetween.

According to another aspect of the present disclosure, there is provided a display device including: a display panel; a module cover disposed at a rear of the display panel; a back cover covering the rear of the module cover; and a latch coupled to each of the module cover and the back cover at a position between the module cover and the back cover, wherein: the module cover provides a space in which the latch is inserted; and the back cover includes a protrusion protruding toward the module cover to be coupled to the latch, wherein the protrusion is disposed opposite to the module cover with the latch being disposed therebetween.

In addition, according to another aspect of the present disclosure, the module cover may further include a plurality of inner surfaces defining the space, wherein the space is elongated, wherein the plurality of inner surfaces may include: a first inner surface disposed at one side in a longitudinal direction of the space; and a second inner surface disposed opposite to the first inner surface with the latch being disposed therebetween, wherein the latch may further include: a first part receiving the first inner surface therein; a second part receiving the second inner surface therein; and a third part disposed between the first part and the second part and facing the protrusion, wherein each of the first part and the second part may contact a front surface and a rear surface of the module cover.

In addition, according to another aspect of the present disclosure, the first part may further include: a first contact surface which contacts the first inner surface, and to which a force for elastic deformation of the first part is applied; and a guide surface facing and spaced apart from the first inner surface, wherein the second part may further include a second contact surface that contacts the second inner surface, wherein a distance between the first contact surface and the second contact surface may be equal to a length of the space.

In addition, according to another aspect of the present disclosure, the third part may further include a bending portion formed by bending the third part toward an inside of the space, wherein the protrusion may further include a locking portion that overlaps with the bending portion in the front-rear direction, wherein the bending portion may include an elastic material.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising: a display panel; a module cover disposed at a rear of the display panel; a back cover covering a rear of the module cover; and a latch positioned between the module cover and the back cover and coupled to each of the module cover and the back cover, wherein the module cover comprises an elongated hole in which the latch is inserted, and comprises a plurality of inner surfaces defining the hole, wherein the plurality of inner surfaces comprises: a first inner surface disposed at one side facing in a longitudinal direction of the hole; and a second inner surface disposed opposite to the first inner surface with respect to the latch, wherein the back cover comprises a protrusion protruding from the back cover toward the module cover to be coupled to the latch, wherein the latch comprises: a first part configured to receive the first inner surface therein; a second part configured to receive the second inner surface therein; and a third part disposed between the first part and the second part and facing the protrusion of the back cover, wherein each of the first part and the second part contacts at least one of a front surface or a rear surface of the module cover, wherein the first part comprises: a first contact surface which contacts the first inner surface, and to which a force for elastic deformation of the first part is applied; and a guide surface facing and spaced apart from the first inner surface, wherein the second part comprises a second contact surface that contacts the second inner surface, and wherein a distance between the first contact surface and the second contact surface is equal to a length of the hole.

2. The display device of claim 1, wherein the latch further comprises a latch body which is elongated in the longitudinal direction of the hole,
wherein one side of the first part is fixed to the latch body, and
wherein the first part further comprises an opening into which a portion of the module cover forming the first inner surface is inserted.

3. The display device of claim 2, wherein the guide surface forms one end of a boundary of the opening of the first part and is adjacent to the one side of the first part, and
wherein the first contact surface forms the other end of the boundary of the opening of the first part and is opposite the guide surface.

4. The display device of claim 3, wherein the first part is spaced rearward from the latch body except for the one side fixed to the latch body.

5. The display device of claim 4, wherein, when a force is applied to the first contact surface, the first part rotates in one direction about the one side of the first part, and
wherein, when the force applied to the first contact surface is removed, the first part rotates in the opposite direction about the one side of the first part.

6. The display device of claim 3, wherein the distance between the guide surface and the second contact surface is shorter than the length of the hole.

7. The display device of claim 6, wherein the first inner surface and the first contact surface are parallel to each other, and
wherein the second inner surface and the second contact surface are parallel to each other.

8. The display device of claim 2, further comprising:
an auxiliary part facing the one side of the first part with respect to the latch body and protruded rearward from the latch body; and
a seating portion bent from the auxiliary part and coming into contact with the rear surface of the module cover,
wherein the other side of the first part opposite to the one side of the first part is free end,
wherein the free end of the first part is positioned between the auxiliary part and the one side of the first part and is spaced apart from the auxiliary part.

9. The display device of claim 8, wherein the auxiliary part is inserted into the hole and positioned in front of the opening of the first part.

10. The display device of claim 9, wherein the length of the latch body is longer than the length of the hole, and the latch body is inserted into the hole and positioned in front of the rear surface of the module cover.

11. The display device of claim 1, wherein the latch further comprises:
a latch body elongated in the longitudinal direction of the hole,
wherein the second part comprises:
a horizontal section protruded rearward from a boundary of the latch body that intersects with the second inner surface;
a wing bent from the horizontal section and coming into contact with the rear surface of the module cover; and
an opening formed by being recessed from one end of the horizontal section facing the second inner surface,
wherein the second contact surface is formed at a boundary of the opening of the second part.

12. The display device of claim 11, wherein the second part further comprises a pair of second parts spaced apart from each other with respect to the latch body.

13. The display device of claim 1, wherein the latch further comprises a latch body elongated in the longitudinal direction of the hole,
wherein the third part comprises a bending portion formed by bending the third part toward an inside of the hole,
wherein the protrusion comprises a locking portion that overlaps with the bending portion in the front-rear direction, and
wherein the bending portion includes an elastic material.

14. The display device of claim 13, wherein the third part further comprises a pair of third parts spaced apart from each other with respect to the latch body,
wherein a space is formed between the pair of third parts, and
wherein the protrusion is inserted into the space.

15. The display device of claim 1, wherein the hole comprises a plurality of holes, and the latch comprises a plurality of latches.

* * * * *